United States Patent [19]
Collins et al.

[11] Patent Number: 5,646,373
[45] Date of Patent: Jul. 8, 1997

[54] APPARATUS FOR IMPROVING THE POWER DISSIPATION OF A SEMICONDUCTOR DEVICE

[75] Inventors: Larry C. Collins, Morton; James G. Cook, Hanna City; John P. Hoffman, Peoria, all of Ill.

[73] Assignee: Caterpillar Inc., Peoria, Ill.

[21] Appl. No.: 539,569

[22] Filed: Oct. 5, 1995

Related U.S. Application Data

[63] Continuation-in-part of Ser. No. 299,094, Sep. 2, 1994, abandoned.

[51] Int. Cl.$^6$ ...................................................... H05K 7/20
[52] U.S. Cl. ............................ 172/252; 361/719; 361/794
[58] Field of Search ............................... 165/80.3, 185; 439/85, 485, 487; 174/252, 260, 262, 16.3; 361/792, 794, 688, 689, 704, 705, 707, 717–719, 722, 767, 778, 783, 784, 790

[56] References Cited

U.S. PATENT DOCUMENTS

| | | | |
|---|---|---|---|
| 3,686,533 | 8/1972 | Garnier et al. | 317/100 |
| 4,729,061 | 3/1988 | Brown | 361/386 |
| 4,731,701 | 3/1988 | Kuo | 361/388 |
| 4,739,448 | 4/1988 | Rowe et al. | 361/386 |
| 4,941,067 | 7/1990 | Craft | 361/386 |
| 4,963,697 | 10/1990 | Peterson | 174/252 |
| 5,119,174 | 6/1992 | Chen | 357/80 |
| 5,173,844 | 12/1992 | Adachi et al. | 361/414 |
| 5,347,091 | 9/1994 | Schroeder | 174/262 |
| 5,506,755 | 4/1996 | Miyagi | 361/720 |

Primary Examiner—Gerald P. Tolin
Attorney, Agent, or Firm—Mario J. Donato; James R. Yee

[57] ABSTRACT

An apparatus for improving the power dissipation of a semiconductor device surface mounted on a printed circuit board having at least a top printed circuit board layer and a bottom printed circuit board layer is provided. The apparatus includes a first pad of metallic material connected to a top surface of the top printed circuit board layer. The semiconductor device is connected to the first pad. A second pad of metallic material is connected a to the top surface of at least one of the top and bottom printed circuit board layers, wherein the second pad is electrically isolated from the semiconductor device. The apparatus also includes at least one thermal via for heat transfer through the printed circuit board layers thermally coupled to the thermal pad. A heat sink is thermally coupled to the at least one thermal via.

4 Claims, 3 Drawing Sheets

Fig_4_
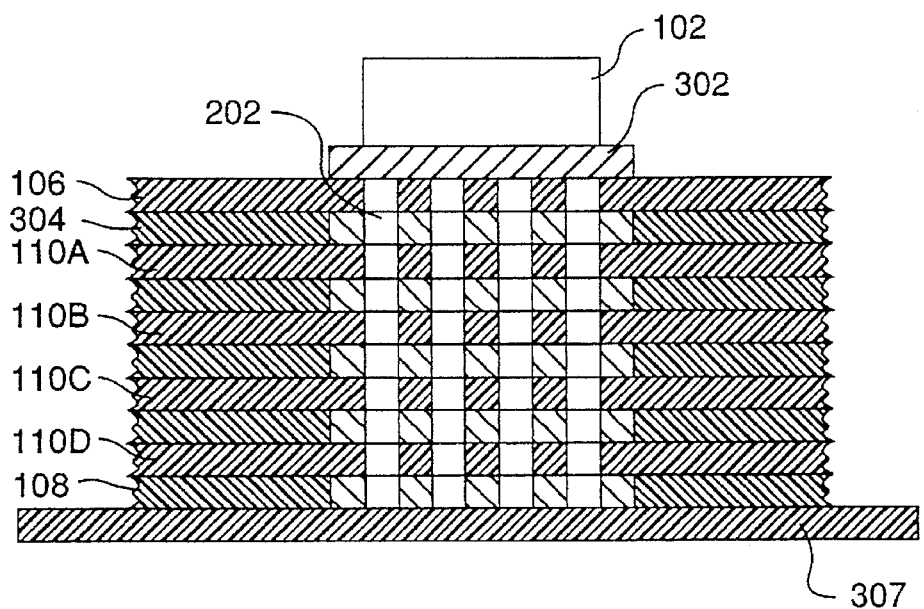
Fig_5_
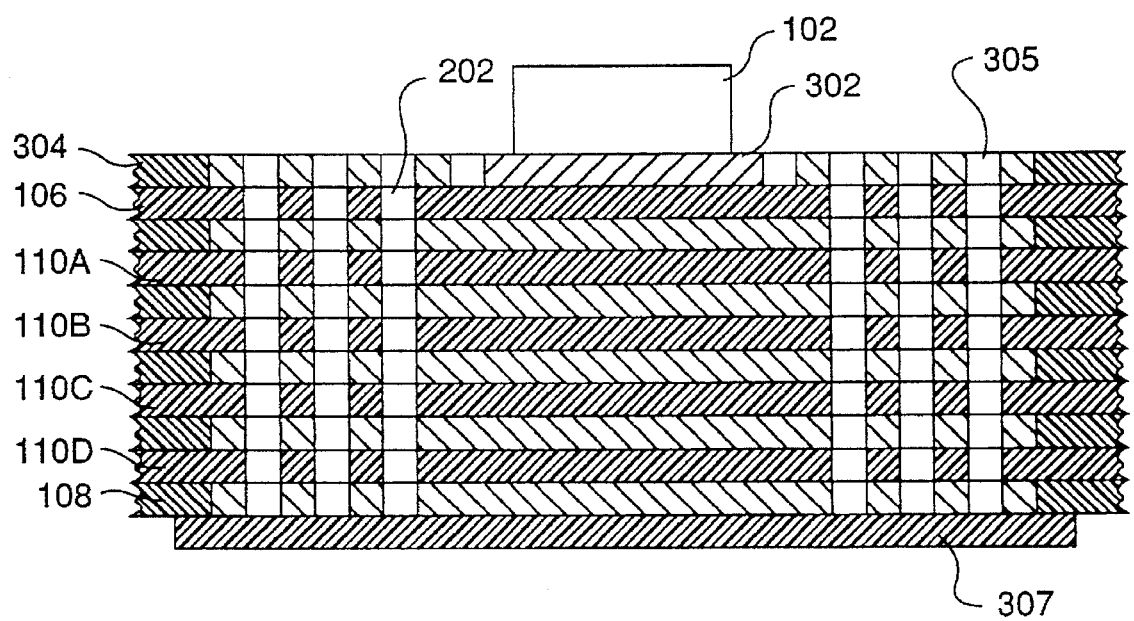

APPARATUS FOR IMPROVING THE POWER DISSIPATION OF A SEMICONDUCTOR DEVICE

This is a Continuation-In-Part of application Ser. No. 08/299,094, filed Sep. 2, 1994, now abandoned.

TECHNICAL FIELD

This invention relates generally to surface mounted semiconductors and, more particularly, to an apparatus for improving the power dissipation of a surface mounted semiconductor.

BACKGROUND ART

Because there is an increasing demand for high density assembly of electronic components in various fields of electronic equipment, recent circuit designs have increasingly utilized surface mounted semiconductor devices. Surface mounted semiconductor devices are smaller than conventional semiconductor devices and thus take up less space on a printed circuit (PC) board. Consequently, it becomes important to efficiently dissipate heat generated from the electronic components mounted on the PC board.

For example, transistors are commonly packaged in surface mount cases. The device's case includes a metallic backing which is soldered to a heat pad or heat sink on the PC board. Unlike conventional heat sinks, a heat sink for a surface mounted device consists of a thin layer of metallic material on the top surface of the PC board. The technical data sheet for a typical surface mounted transistor contains two power dissipation values. The first power dissipation ($P_{D1}$) reflects the maximum power that the device can dissipate with a heat sink having the recommended dimensions. For example, a typical $P_{D1}$ value is 1.56 watts when the ambient temperature is 25° C. The second power dissipation value ($P_{D2}$) reflects the maximum power that the device can dissipate when the device's case is held at a specific temperature. For example, a typical device may be capable of dissipating 15 watts if the case temperature is held at 25° C. Thus, as can be seen, if the case is held at a lower temperature, the device can dissipate up to 10 times the power. However, the technical data sheets include no suggestions as to how to keep the case temperature down at that level.

The present invention is directed to overcoming one or more of the problems, as set forth above.

DISCLOSURE OF THE INVENTION

In one aspect of the present invention an apparatus for improving the power dissipation of a semiconductor device surface mounted on a PC board having at least a top PC board layer and a bottom PC board layer is provided. The PC board layers are both thermally and electrically connected to each other, except that one of the conductive pads that the semiconductor device is thermally coupled to is not electrically connected to the semiconductor device it is to protect, such that the thermal and electrical paths are separate and distinct. The apparatus includes a pad of metallic material connected to a top surface of the top PC board layer. The semiconductor device has a heat transfer portion connected to the thermal pad. The apparatus also includes at least one conduit portion for heat transfer connected to the PC board and being thermally coupled to the thermal pad. The conduit portion is in the form of a thermal via. A thermal plane layer is thermally coupled to the at least one conduit portion.

BRIEF DESCRIPTION OF THE DRAWINGS

FIG. 4 is a simplified partial composite sectional view of the preferred embodiment of the present invention; and FIG. 5 is a simplified partial composite sectional view of the alternate embodiment shown in FIG. 3.

DESCRIPTION OF THE PREFERRED EMBODIMENTS

Figure 1:
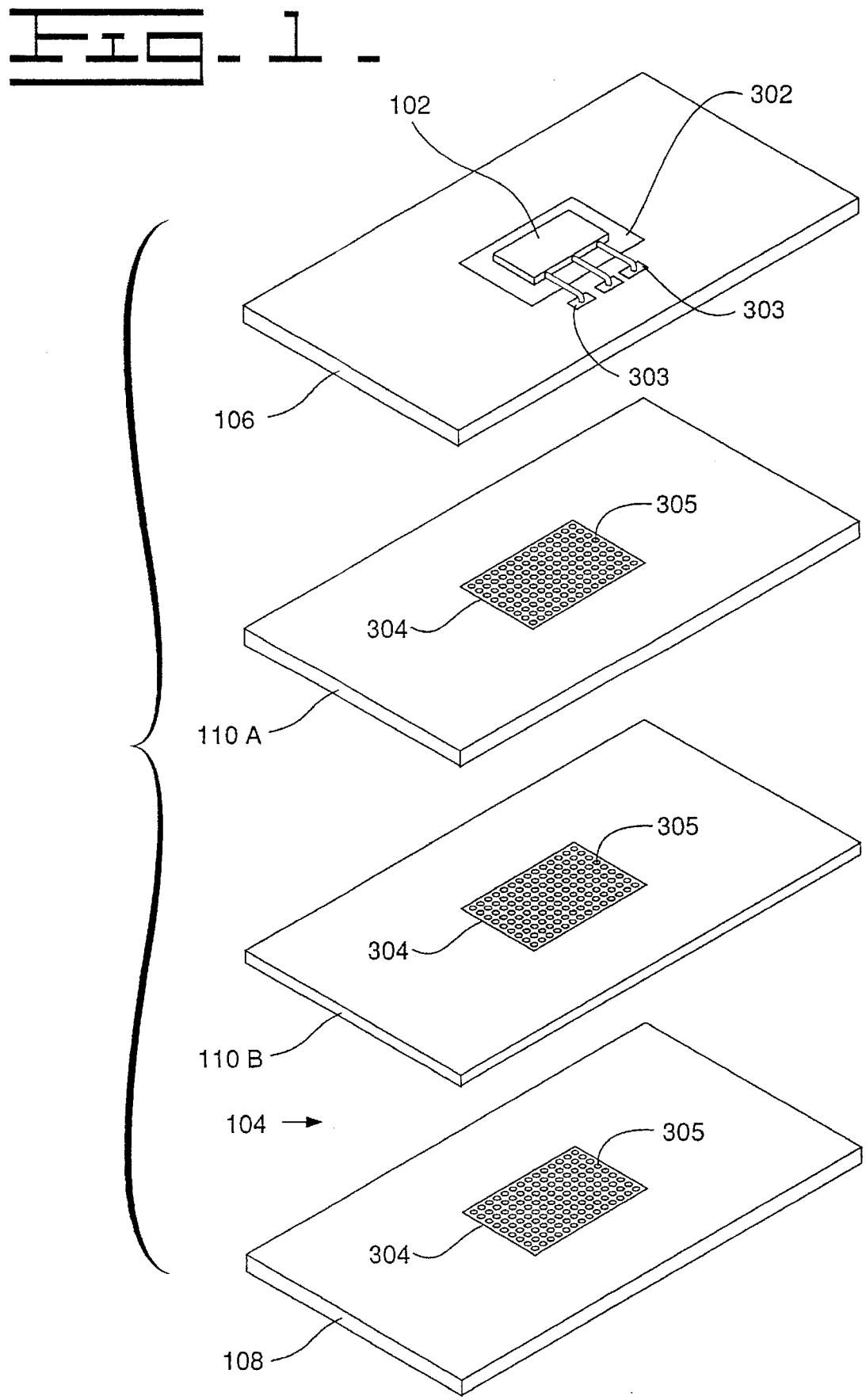
FIG. 1 is a diagrammatical illustration of the preferred embodiment of a PC board apparatus for improving the power dissipation of a surface mounted semiconductor device.
Figure 2:
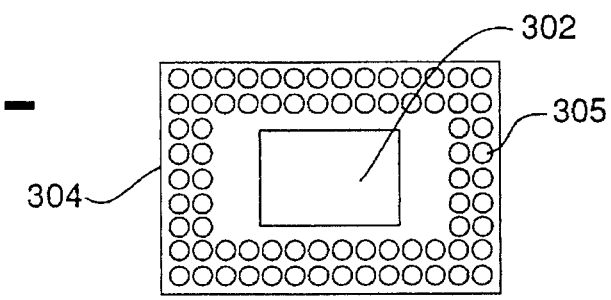
FIG. 2 is an illustration of a portion of the present invention including a "thermal" pad and a "conductive" pad, according to an embodiment of the present invention.

With reference to FIG. 1, the present invention provides an apparatus 100 for improving the power dissipation of a semiconductor device 102 surface mounted on a printed circuit (PC) board 104. The PC board has at least a top PC board layer 106 and a bottom PC board layer 108. In the preferred embodiment, the PC board 104 is a multi-layered board having a top PC board layer 106, a bottom PC board layer 108, and a plurality of intermediate board layers 110. For purposes of illustration, the PC board 104 of FIG. 1 is shown as having two intermediate board layers 110A, 110B. However, the PC board could include any number of intermediated board layers (including zero) without departing from the spirit of the invention.

Generally, the upper surface of the top PC board layer 106 is clad with a conductive layer of copper which has been patterned to form circuit traces (not shown). Each intermediate layer 110A and 110B is typically clad on a top surface thereof with a conductive layer of copper. Furthermore, it should be noted that each PC board layer comprises a multi layer structure of resin and fiberglass reinforcements which have been bonded together, forming an insulation layer between the copper clad layers. A number of electrical elements are soldered to the PC board and interconnected in a predesigned arrangement via the metallic traces. Thus, typically, at least the top surface of each printed circuit board layer will contain traces. Furthermore, traces on respective layer surfaces may be connected to traces on other layers via conduits, as is generally known in the art. For simplicity, the traces and other components are not shown. Additionally, PC boards commonly have at least one power plane and one ground plane. The power and ground planes are enlarged layers or traces connected to the surface of one of the PC board layers. The power plane is connected to a source of electrical power, e.g., a +5 volt power supply or regulator. The ground plane is connected to electrical ground.

Referring now to FIG. 1, the preferred embodiment of the apparatus is shown. As seen in FIG. 1, the apparatus 100 includes a pad 302 of metallic material, preferably copper, connected to the top surface of top PC board layer 106. Another metallic pad 304 is disposed on the next successive PC board layer 110A, and is thermally coupled to pad 302 as follows. Pads 302 and 304 are thermally coupled vertically through the printed circuit board first layer 106 (e.g. from pad 302 to pad 304 on the next layer down). Because the length of the path is short through the printed circuit board layer (approximately 0.007 inches), and because the area is large, the thermal path between pads 302 and 304 is a good one. Semiconductor device 102 is coupled to pads 302 and pads 303, wherein pads 302 and 303 provide some heat dissipation for semiconductor device 102. Further, pads 302 and 303 are for both thermal and electrical connection with the transistor die. Pad 304 is both electrically and thermally conductive from one side of the printed circuit board to the other. However, pad 304 is not electrically connected to the semiconductor device it is to protect. Each successive PC board layer (e.g. 110A, 110B, 108) contains a metallic pad 304, preferably made of copper, disposed on the top surface thereof. The pads 304 correspond to the semiconductor device 102. Each copper pad is preferably the same size, and if there are intermediate PC board layers, is aligned with a corresponding copper pad disposed on the other PC board layers. Each copper pad 304 has a plurality of apertures 305 disposed therein for thermal conduction. The apertures 305 are aligned from pad 304 to pad 304 and from PC board layer to PC board layer, and therefore extend through the "thickness" of the PC board, excepting top PC board layer 106.

In the embodiment illustrated in FIGS. 1 and 4, pad 304 is coupled to the top surface of intermediate PC board layer 110A and is electrically isolated from pad 302; however, the two are thermally coupled as described above in that although the PC board is constructed of material generally described as an insulator, because of the small distances involved, heat will conduct from pad 302 to pad 304.

Referring now to FIG. 4, a simplified partial composite sectional view of the preferred embodiment is shown for explanatory purposes. Semiconductor device 102 is coupled to pads 302 and 303, which are connected to the top surface of top PC board layer 106. Each successive PC board layer has pad 304 disposed thereon, wherein pad 304 is thermally coupled to and electrically isolated from pad 302. As seen in FIG. 4, each PC board layer other than the top PC board layer 106 has a plurality of holes 202 therein which are aligned with corresponding apertures 305 of pad 304, thereby forming vias. The vias are lined with conductive metallic material by electroplating, thereby forming thermal vias. The thermal vias provide for thermal conduction from the top PC board layer 106 down to the bottom PC board layer 108, which is coupled to heat sink 307.

Figure 3:
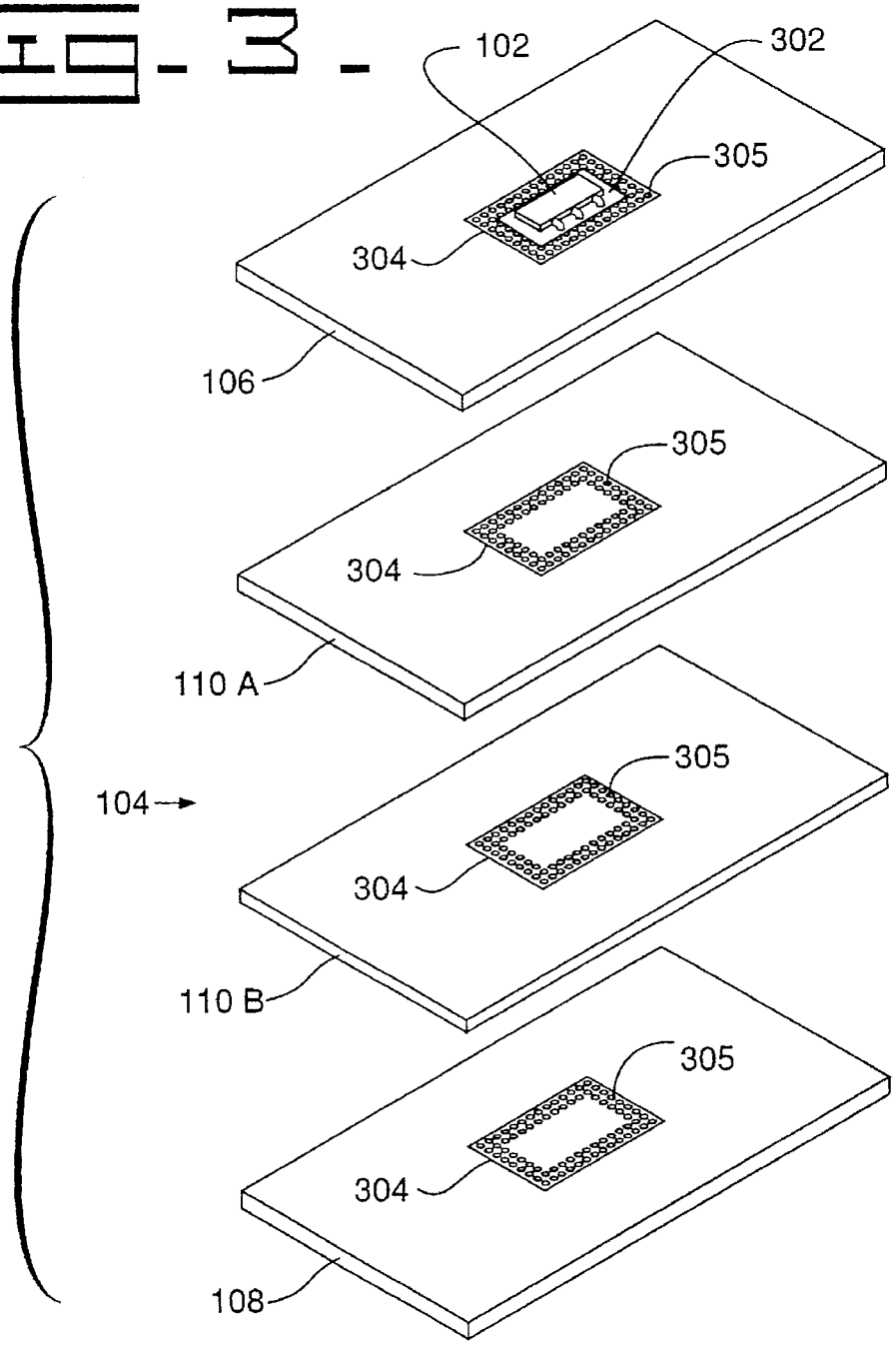
FIG. 3 is a diagrammatical illustration of an alternate embodiment of a PC board apparatus for improving the power dissipation of a surface mounted semiconductor device.

Referring now to FIG. 3, an alternate embodiment of the apparatus is shown. As seen in FIG. 3, the apparatus 100 includes a pad 302 of metallic material, preferably copper, connected to the top surface of top PC board layer 106. Another metallic pad 304 is thermally coupled to pad 302. Pads 302 and 304 are thermally coupled horizontally via the printed circuit board material between the pads 302 and 304, and are thermally coupled vertically through the printed circuit board first layer 106 (e.g. from pad 302 to pad 304 on the next layer down). Because the length of the path is short through the printed circuit board layer (approximately 0.007 inches), and because the area is large, the thermal path between pads 302 and 304 is a good one. Semiconductor device 102 is coupled to pad 302, wherein pad 302 provides some heat dissipation for semiconductor device 102. Further, pad 302 is for both thermal and electrical connection with the transistor die. Pad 304 is both electrically and thermally conductive from one side of the printed circuit board to the other. However, pad 304 is not electrically connected to the semiconductor device it is to protect. Each successive PC board layer (e.g. 110A, 110B, 108) contains a metallic pad 304, preferably made of copper, disposed on the top surface thereof. The pads 304 correspond to the semiconductor device 102. Each copper pad is preferably the same size, and if there are intermediate PC board layers, is aligned with a corresponding copper pad disposed on the other PC board layers. Each copper pad 304 has a plurality of apertures 305 disposed therein for thermal conduction. The apertures 305 are aligned from pad 304 to pad 304 and from PC board layer to PC board layer, and therefore extend through the "thickness" of the PC board, as will be described in greater detail hereinbelow.

In the embodiment illustrated in FIGS. 3 and 5, pad 304 is coupled to the top surface of top PC board layer 106 and is electrically isolated from pad 302; however, the two are thermally coupled as described above in that although the PC board is constructed of material generally described as an insulator, because of the small distances involved, heat will conduct from pad 302 to the surrounding conducting portion 304. Furthermore, heat conduction will pass through the top PC board layer 106 to the next PC board layer, which is clad with a copper layer.

Referring to FIG. 5, a simplified partial composite sectional view is shown for explanatory purposes. Pad 304 is coupled to the top surface of top PC board layer 106. Semiconductor device 102 is coupled to pad 302, which is thermally coupled to and electrically isolated from pad 304. As seen in FIG. 5, each PC board layer (e.g. 106, 110A, 110B, 110C, and 108) has formed therein, as by drilling or by plasma etching, a plurality of holes 202 which are aligned with corresponding conducting pad apertures 305, thereby forming vias. The vias are lined with conductive metallic material by electroplating, thereby forming thermal vias. The thermal vias provide for thermal conduction from the top PC board layer 106 down to the bottom PC board layer 108, which is coupled to a heat sink 307. Further, because of the vias, all pads 304 are connected both thermally and electrically.

INDUSTRIAL APPLICABILITY

With reference to the drawings and in operation, the present invention provides an apparatus 100 for improving the heat dissipation of a surface mounted semiconductor device 102. As described above, apparatus 100 includes a metallic pad 302 connected to the top surface of top PC board layer 106. Semiconductor device 102 is coupled to pad 302, wherein pad 302 provides some heat transfer for semiconductor device 102. A conductive metallic pad 304 is thermally coupled to pad 302. Each successive PC board layer (e.g. 110A, 110B, 108) contains a conductive metallic pad 304 disposed on the top surface thereof. Each conductive metallic pad 304 has apertures 305 therein for thermal conduction. Each pad 304 is thermally coupled to and electrically isolated from pad 302. The present invention also includes at least one thermal via for heat transfer disposed in the PC board and being thermally coupled to the thermal pad 302 and the heat sink 307.

Since a circuit design will normally include many semiconductor devices, the present invention may be adapted to allow the power dissipation of each to be increased.

Other aspects, objects, and features of the present invention can be obtained from a study of the drawings, the disclosure, and the appended claims.

We claim:

1. An apparatus for improving the power dissipation of a semiconductor device surface mounted on a printed circuit, comprising:

a top printed circuit board layer having a top surface and a bottom surface;

a bottom printed circuit board layer having a top surface and a bottom surface;

a first pad of metallic material connected to the top surface of said top printed circuit board layer, wherein the semiconductor device is connected to said first pad;

a second pad of metallic material connected to the top surface of said top printed circuit board layer, said second pad surrounding said first pad, said second pad being electrically isolated from the semiconductor device, said second pad having a plurality of apertures therein;

a plurality of intermediate printed circuit board layers, each of said intermediate layers having a metallic pad identical to that of said second pad connected to a top surface thereof, said second and intermediate layer metallic pads being aligned;

a plurality of vias for heat transfer through the printed circuit board layers, each of said vias being thermally coupled to each of said pads; and a heat sink thermally coupled to said plurality of vias.

2. An apparatus as recited in claim 1, including a pad of metallic material identical to that of said second pad connected to the top surface of the bottom printed circuit board layer, said second, intermediate layer, and bottom layer pads being aligned.

3. An apparatus for improving the power dissipation of a semiconductor device surface mounted on a printed circuit board, comprising:

a top printed circuit board layer having a top surface and a bottom surface;

a bottom printed circuit board layer having a top surface and a bottom surface;

a first pad of metallic material connected to the top surface of said top printed circuit board layer, wherein the semiconductor device is connected to said first pad;

a second pad of metallic material connected to the top surface of said bottom printed circuit board layer, said second pad being electrically isolated from the semiconductor device, said second pad having plural apertures apertures therein;

at least one intermediate printed circuit board layer, said intermediate layer having a pad of metallic material identical to that of said second pad connected to a top surface thereof, said bottom and intermediate layer pads being aligned, said bottom layer and said intermediate layer each having plural apertures aperture therein, said at least one layer apertures being aligned with said pad apertures, said at least one layer apertures and said pad apertures thereby forming at least plural vias for heat transfer through the printed circuit board layers, said vias being thermally coupled to each of said pads; and a heat sink thermally coupled to said vias.

4. An apparatus as recited in claim 3, including further pads of metallic material connected to the top surface of the top printed circuit board layer and to the semiconductor device, said further pads being spaced a predetermined distance from said first pad.

* * * * *

UNITED STATES PATENT AND TRADEMARK OFFICE
CERTIFICATE OF CORRECTION

PATENT NO.   : 5,646,373
DATED        : July 8, 1997
INVENTOR(S)  : Collins, et al.

It is certified that error appears in the above-identified patent and that said Letters Patent is hereby corrected as shown below:

Column 6, line 16, delete "aperture."

Signed and Sealed this

Tenth Day of March, 1998

Attest:

BRUCE LEHMAN

Attesting Officer          Commissioner of Patents and Trademarks